United States Patent [19]
Ashby et al.

[11] Patent Number: 6,023,196
[45] Date of Patent: Feb. 8, 2000

[54] BIAS CIRCUIT FOR TRANSCONDUCTANCE AMPLIFIER

[75] Inventors: Kirk B. Ashby; Paul C. Davis, both of Reading; Michael D. Womac, Blandon, all of Pa.

[73] Assignee: Lucent Technologies Inc., Murray Hill, N.J.

[21] Appl. No.: 09/127,752

[22] Filed: Aug. 3, 1998

[51] Int. Cl.[7] ............................... H03F 1/30; H03F 3/45
[52] U.S. Cl. ........................................... 330/290; 330/259
[58] Field of Search ................................... 330/252, 259, 330/261, 290, 296

[56] References Cited

U.S. PATENT DOCUMENTS

| 4,459,553 | 7/1984 | Diller | 330/290 X |
|---|---|---|---|
| 4,849,712 | 7/1989 | Jarrett | 330/290 X |
| 5,008,632 | 4/1991 | Sutterlin | 330/259 X |

OTHER PUBLICATIONS

"An Integrated Silicon Bipolar Receiver Subsystem for 900MHz ISM Band Applications", by Jeff Durec, Proceedings of the 1997 Bipolar/BiCMOS Circuits and Technology Meeting, sponsored by IEEE Electron Devices Society, Sep. 1997, 6 pages.
"TP 3.5: A 2.7–5.5V 0.2–1W BiCMOS RF Driver Amplifier IC with Closed–loop Power Control and Biasing", by S. Wong, S. Luo, and L. Hadley, 1998 IEEE International Solid–State Circuits Conference, 5 pages.

Primary Examiner—Steven J. Mottola

[57] ABSTRACT

In low-voltage circuits, there is often insufficient voltage to use a current source to bias a transconductance amplifier stage. This is particularly true in mixers where a switching circuit must be stacked on top of the transconductance input stage. One way around this problem is to get "double-duty" out of the input differential pair, using it both for gain stage and for DC bias. This is done by AC coupling in a high-frequency input signal, while using a low-frequency, DC-coupled circuit to establish the proper bias level. One common technique is to use a simple current mirror scheme to establish the DC level. Proper biasing using this technique requires good matching of resistance. In some implementations of transconductance amplifiers, particularly those that use inductors as degeneration elements, series resistance of the inductor and interconnect resistance can cause significant errors in the bias current. This invention addresses that problem by using an operational amplifier with a current-sensing resistor and a low-frequency feedback loop to compensate automatically for any resistance errors. The operational amplifier drives the feedback voltage (generated in accordance with the sensed voltage at the current-sensing resistor and applied to one input of the operational amplifier) towards a reference voltage that is applied to the other input of the operational amplifier to bias the transistor(s) in the transconductance amplifier for desired operating conditions.

32 Claims, 5 Drawing Sheets

BIAS CIRCUIT FOR TRANSCONDUCTANCE AMPLIFIER

BACKGROUND OF THE INVENTION

1. Field of the Invention

The present invention relates to integrated circuits, and, in particular, to transconductance amplifiers.

2. Description of the Related Art

A transconductance amplifier converts an input voltage signal into an output current signal, where output current is proportional to the input voltage. Conventional transconductance amplifiers have a transistor to provide amplification of the input signal and a DC bias circuit to bias the transistor for operations. In order to save power, e.g., in many battery-operated devices, circuits having transconductance amplifiers may be required to operate from low supply voltages. Typically, a certain minimum voltage is required in order to bias a transconductance amplifier for proper operation. As supply voltages decrease, the available voltage approaches, or in some cases drops below, the minimum voltage needed to bias the circuit.

FIG. 1 shows a traditional Gilbert cell mixer implementation that is used to illustrate this problem. In this circuit, three levels of transistors are stacked in the available power supply voltage. These are the current source formed by transistor B17, the transconductance stage which includes transistors B11 and B12, and the mixing core of transistors B13, B14, B15, and B16. Transistors B18 and B19 are part of a current mirror used to set the current in transistor B17. There is additional voltage drop across the current source resistor R15, the degeneration resistors R11 and R12, and the load resistors R13 and R14. At low power supply voltages required by some applications, it may become impossible to bias the transconductance stage for proper circuit operations.

FIG. 2 shows a modification to the traditional Gilbert cell mixer of FIG. 1 that helps to alleviate some of the biasing problems for a high-frequency, narrow-band circuit. Instead of using a separate current source such as was done with transistor B17 of FIG. 1, in the circuit of FIG. 2, transistors B21 and B22 perform double duty: providing both DC bias and AC gain. They, along with resistor R25, form a current mirror with transistors B28 and B29 and resistor R26 to set the proper DC bias level.

In order to eliminate the DC voltage drop and to reduce thermal noise, inductors L21 and L22 are used as degeneration devices instead of the resistors R11 and R12 of FIG. 1. At high frequencies, inductors L21 and L22 provide the necessary impedance for degeneration but do not suffer from DC voltage drop and do not contribute significant thermal noise.

Capacitors C21 and C22 allow the AC input signal to be coupled into the transconductance amplifier while simultaneously blocking any DC signals that could disrupt the bias scheme. Resistors R21 and R22 are used to provide a high differential impedance between the inputs to the transconductance amplifier. Because some base current flows through resistors R21 and R22 and creates a voltage drop, resistor R27 is used to create a compensating voltage drop in the path to the base of transistor B28. Inductor L23 provides an impedance at high frequencies that improves the common-mode performance of the mixer.

A problem exists with the circuit in FIG. 2 that can be explained by comparing the bias circuit in FIG. 1 to the bias circuit of FIG. 2. In FIG. 1, suppose that it is desired to operate the circuit such that the output of the current source (i.e., transistor B17) is M times larger than some current reference IREF1. Ignoring second-order effects, this may be accomplished by setting the area of transistor B17 to be M times larger than the area of transistor B18, and setting the value of resistor R16 to be M times the value of resistor R15. By scaling the transistor sizes, the same current density is maintained in transistors B18 and B17 resulting in an identical emitter-base voltage (Vbe) for both transistors. Let VREF1 be the voltage at node 1F (this is approximately equal to IREF1 *R16), then the voltage at node 1E will be VREF1+Vbe −Vbe =VREF1. The current in resistor R15 is approximately equal to the output current of the current source and is equal to VREF1/R15=M*VREF1/R16= M*IREF1 as desired.

Similar DC operation is intended for the circuit of FIG. 2. In this circuit, it is assumed that the voltage drop across the inductors is zero and that half of the current flows through transistor B21 and half through transistor B22, with the total current flowing through resistor R25. If the total current in resistor R25 is desired to be M times IREF2, then transistors B21 and B22 are designed to be M/2 times as large as transistor B28. The value of resistor R26 is set to be M times larger than the value of resistor R25. The value of resistor R27 is set to be M/2 times as large as the values of resistor R21 or resistor R22, which are assumed to be equal in value. Under these conditions, the current in resistor R25 is M*IREF2, as desired.

An implicit assumption in the above analysis is that the resistance of the metal used for interconnection is zero. In reality, this is never the case, but it is usually low enough that it does not introduce a significant error. However, this is not necessarily a valid assumption for the circuit shown in FIG. 2. Integrated inductors are made of spirals of metal that can have significant resistance. If the resistance of the inductors is large enough compared to the value of resistor R25, significant errors will occur in the bias scheme. This is particularly true for large bias currents where resistor R25 will have a relatively low value. This could be addressed by adjusting the value of resistor R25 or resistor R26, but since the temperature characteristics of the resistors will not be the same as those of the metal, such a correction will introduce bias errors as temperature changes.

This problem is illustrated in FIG. 3, where the series resistance of the inductors is represented as resistors RMET31, RMET32, and RMET33. In order to compensate for this error, it is possible to add metal resistance in series with resistor R36 as represented by resistor RMET34 in FIG. 3. The value of resistor RMET34 needed to compensate for the inductor resistance(assuming resistor RMET31 is equal to resistor RMET32) is M * (RMET33+RMET31/2). The area needed to implement such a resistor can be very large and can add significant cost to an integrated circuit.

SUMMARY OF THE INVENTION

The present invention is directed to a scheme for biasing the transistor(s) of a transconductance amplifier to attempt to compensate for the parasitic resistance of inductors (i.e., the inherent resistance in the inductor wiring) used to implement such amplifiers in integrated circuits.

In one embodiment, the present invention is an integrated circuit having a transconductance amplifier adapted to convert a first input voltage into an output current. The transconductance amplifier comprises (a) a first transistor configured to provide both DC bias and AC gain for the transconductance amplifier; and (b) a bias circuit, configured to bias the first transistor. The bias circuit comprises (1) a first DC-blocking capacitor connected between the first input voltage and the base of the first transistor; (2) an operational amplifier having first and second inputs and an output, wherein the first input is configured to receive a reference voltage; (3) a first AC-blocking impedance connected between the output of the operational amplifier and the base of the first transistor; and (4) a current-detecting resistor configured to generate a sensed voltage corresponding to the output current. A feedback voltage corresponding to the sensed voltage is applied in a feedback loop to the second input of the operational amplifier to drive the voltage at the base of the first transistor towards equalizing the feedback voltage and the reference voltage to establish an operating condition for the transconductance amplifier.

BRIEF DESCRIPTION OF THE DRAWINGS

Other aspects, features, and advantages of the present invention will become more fully apparent from the following detailed description, the appended claims, and the accompanying drawings in which:

DETAILED DESCRIPTON

Figure 1:
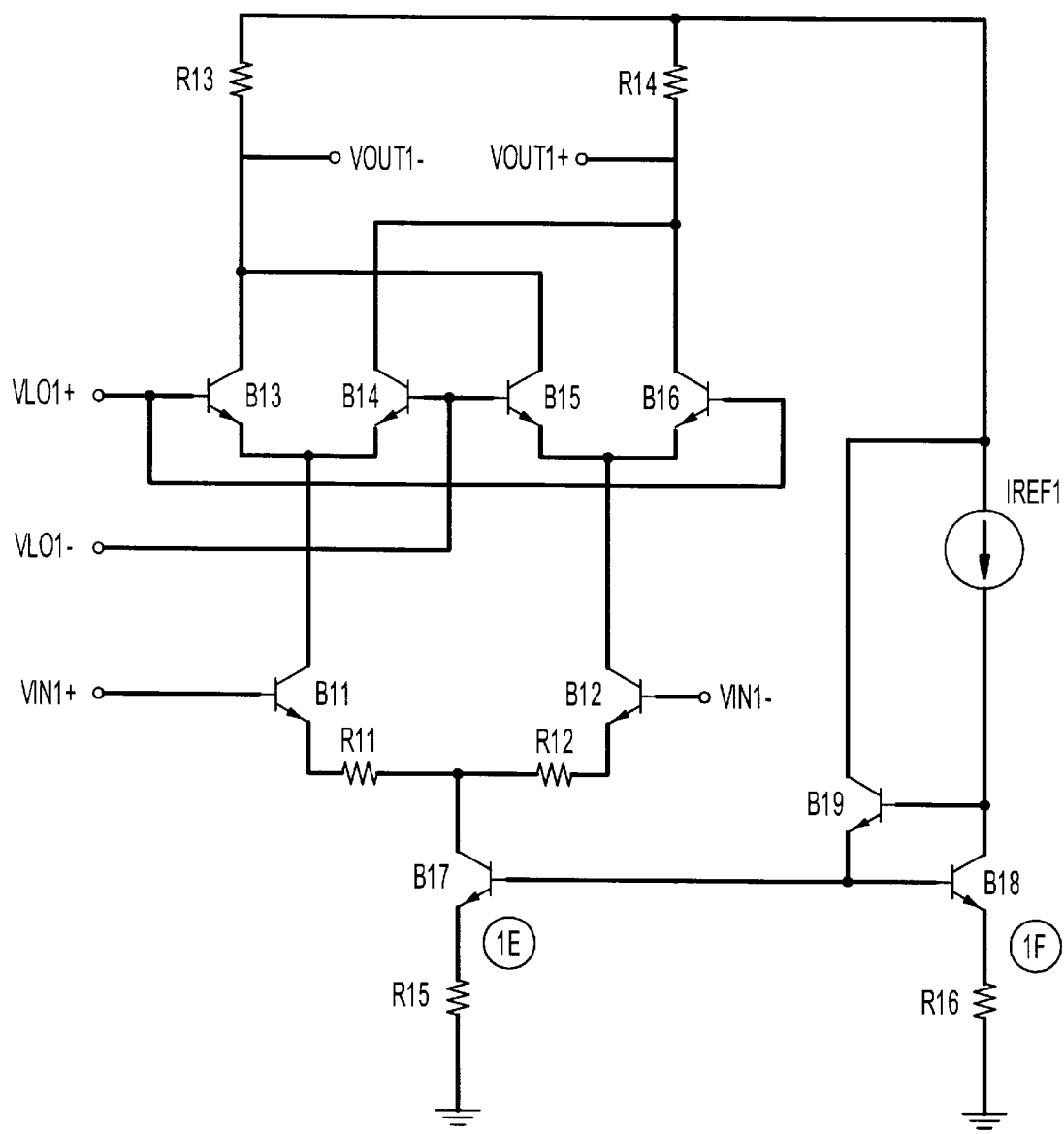
FIGS. 1–3 show three prior art circuits having a transconductance amplifier.
Figure 2:
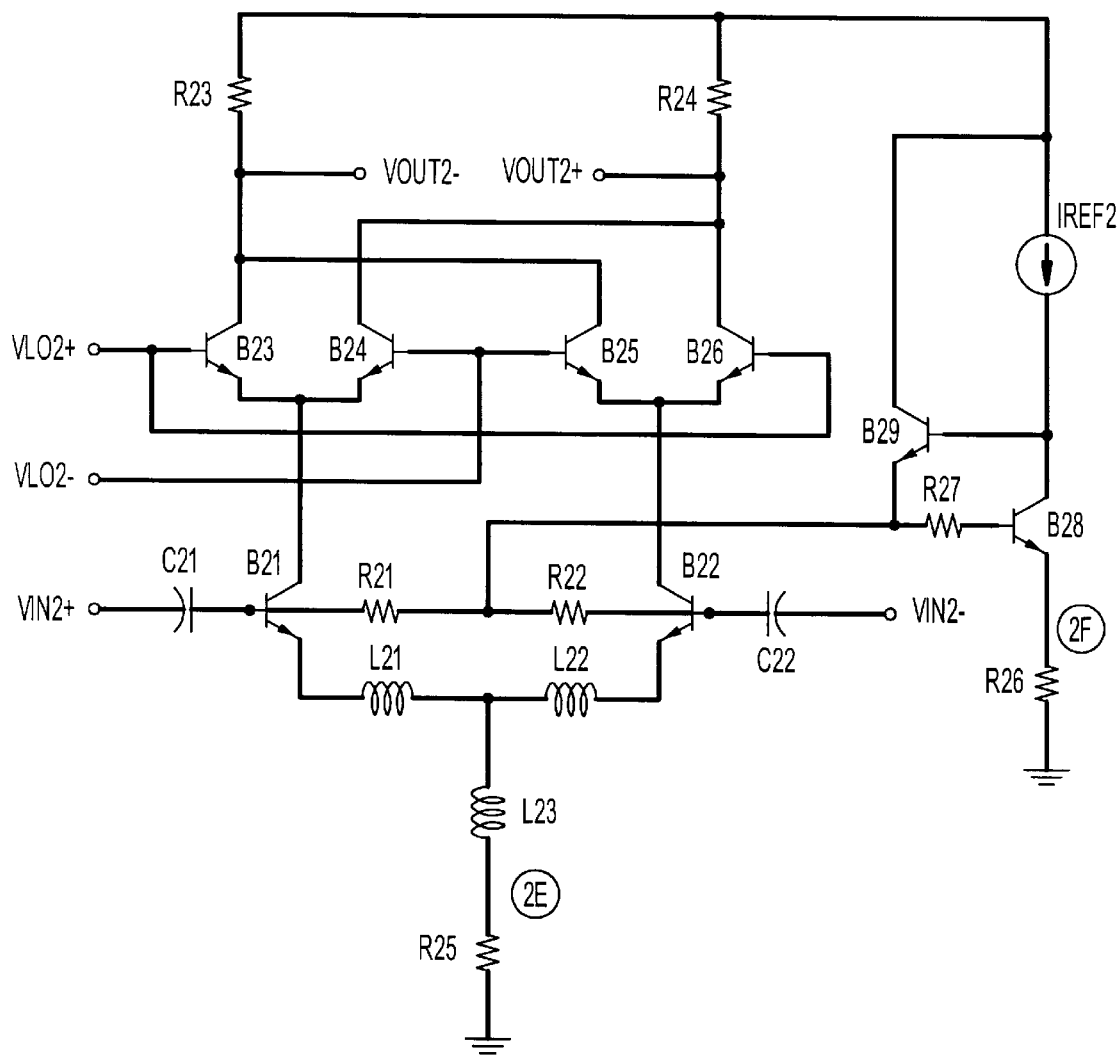
Figure 3:
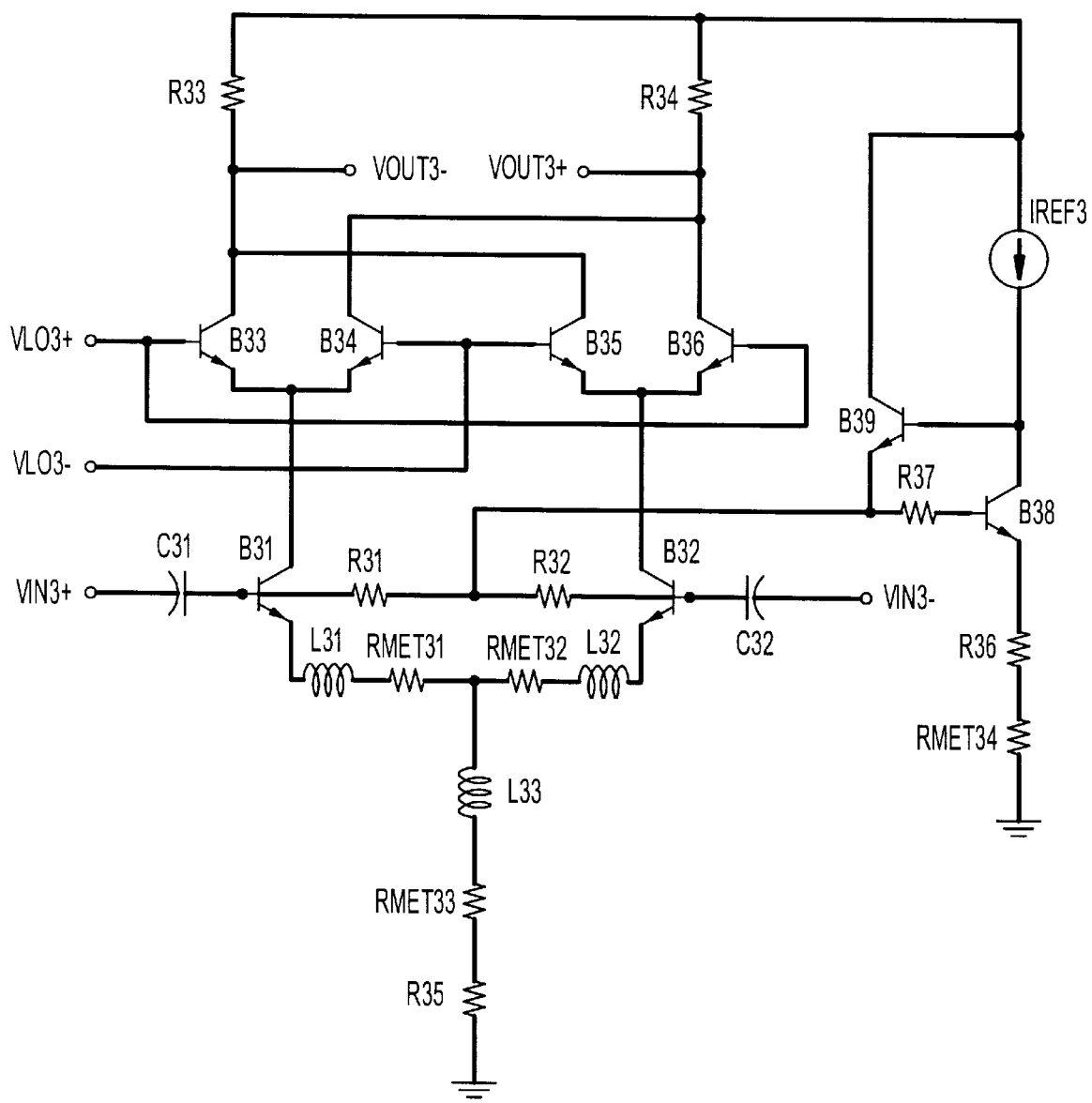
Figure 4:
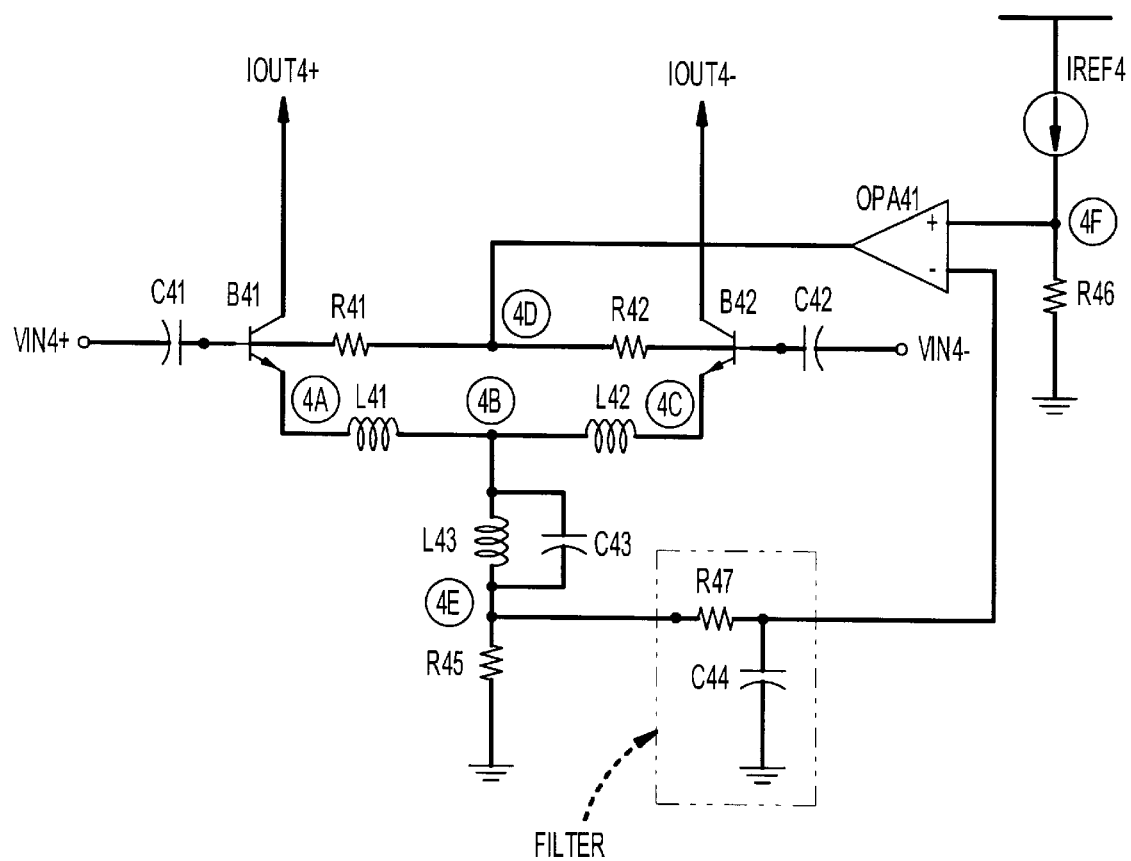
FIGS. 4–6 show three circuits having transconductance amplifiers according to the present invention.

FIG. 4 shows a circuit that addresses the interconnection problem introduced by the resistance of the inductors and any interconnect resistance in series with the inductors. In this circuit, only the transconductance amplifier portion of the circuit has been shown, since this solution is applicable to any transconductance stage, not just those used as part of a mixer, as in the circuits of FIGS. 1–3.

In the circuit of FIG. 4, an operational amplifier is used in a feedback loop to establish the desired bias conditions. A current IREF4 is driven into a resistor R46 to establish a reference voltage at the positive input to the operation amplifier OPA41. The negative input is tied to the current sensing resistor R45. The feedback loop drives the voltage at node 4D to be the level required to make the voltage at node 4E equal to the reference voltage at node 4F. Since the voltages at nodes 4E and 4F are forced to be equal, the current through resistor R45 can be set to M times the reference current by setting R46 to be M times larger than R45.

At low frequencies, the feedback loop forces the current to be a constant value. This maintains the desired bias level and also results in good low-frequency common-mode rejection. At high frequencies, however, the operational amplifier does not have sufficient gain to force the current to be constant and common-mode performance will degrade. To compensate for this, it is desirable to maximize the impedance between node 4B and ground at high frequencies. This can be done by using a parallel resonant circuit between node 4B and the current sensing resistor R45. This resonant circuit is designed to resonate at the desired operating frequency. This has been illustrated in FIG. 4 by placing a capacitor C43 in parallel with inductor L43. This is one possible implementation, but it is also possible to implement this by using an inductor which is naturally self-resonant at the desired operating frequency.

When large signals are input into the transconductance amplifier formed by transistors B41 and B42 and inductors L41 and L2, it is possible for a large AC signal to be present at node 4E. This AC signal may affect the operating point of operational amplifier OPA41 in an undesirable fashion. To address that problem, a filter may be placed in the feedback loop between node 4E and the inverting input of the operational amplifier. One possible implementation of such a filter is shown where resistor R47 and capacitor C44 form a low-pass filter to filter out the high-frequency signals that might otherwise affect operational amplifier OPA41.

The value of the reference voltage may be selected for reasons other than the value of the bias current. Once it is selected, the resistor values can be chosen. One consideration in setting the reference voltage (VREF) is the magnitude of this voltage relative to any offset voltage that may be present at the input to the operational amplifier. The larger VREF is, the smaller will be the bias error from input offsets. For example, if the input offset of the operational amplifier is causing a 5% error, doubling VREF will reduce this error to 2.5%. A large VREF is desirable, but increasing VREF eventually causes problems with biasing for low-voltage operation. The value selected will almost always be a compromise.

Alternative Embodiments

In FIG. 4, the reference voltage at node 4F, which is applied to the positive input of the operational amplifier, is generated by a current source (IREF4) driving a reference current through a reference resistor (R46). For the biasing scheme of the present invention, what is important is providing an appropriate reference voltage, not how that reference voltage is generated. In alternative embodiments, the reference voltage may be generated on chip by means other than a current source in series with a reference resistor. For example, in some embodiments, the reference voltage input to the operational amplifier may be provided by a band-gap voltage reference. In other embodiments, the reference voltage may be supplied by a power supply external to the integrated circuit on which the transconductance amplifier is implemented.

Inductors L41 and L42 of the circuit of FIG. 4 could be replaced with resistors, or they could be removed altogether for some applications. Inductor L43 could also be replaced with a resistor and capacitor C43 eliminated. This would require higher supply voltages, but the circuit will still work. It would also be possible to replace resistors R41 and R42 with large inductors that would provide a large differential input impedance at some desired input frequency. Another variation would be to place a capacitor in parallel with resistor R45 in order to create a good AC ground at node 4E. This capacitor will create a series resonance with inductor L43 that will degrade common-mode performance, but the capacitor may be chosen to place the series resonance at a frequency which may not degrade the performance of the circuit for some desired application. All bipolar transistors shown in the circuit could be replaced with MOS transistors, in which case the control terminal of the transistor is referred to as the gate rather than as the base.

Figure 5:
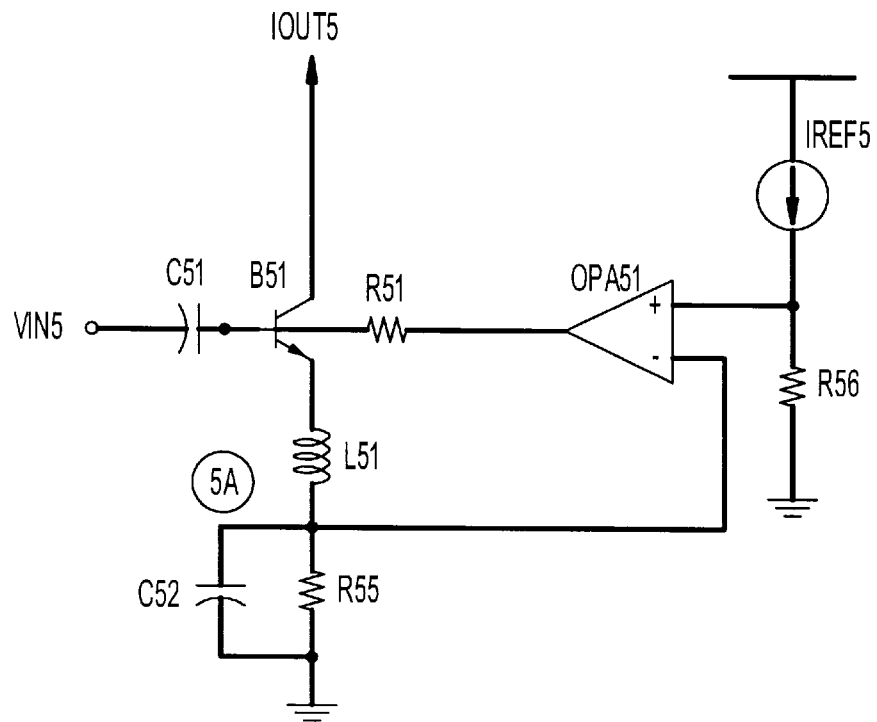

FIG. 5 shows a variation of the invention that could be applied to single-ended amplifiers. Capacitor C52 is used to provide a high-frequency ground at node 5A. Inductor L51 provides degeneration for improved linearity, but may not be needed or desired for some applications such as a low-noise amplifier.

Figure 6:
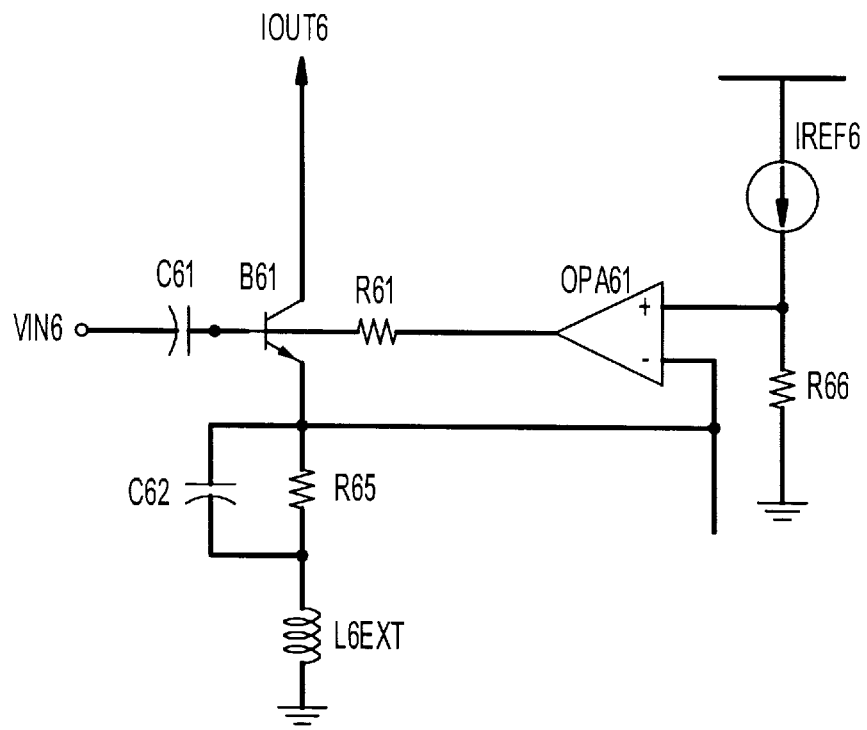

FIG. 6 shows a second variation for a single-ended amplifier. In this variation, it is assumed that a low-resistance external (to the integrated circuit) inductor is available. This is represented as inductor L6EXT in FIG. 6 and could be implemented using the bond wire and package pin inductance of a typical integrated circuit package.

Because of the low DC resistance of inductor L6EXT, the current can still be sensed through resistor R65. Capacitor C62 is used to provide an AC short circuit around current-sensing resistor R65. This reduces the effect that resistor R65 has on the AC gain of the circuit, and also reduces the noise contribution of resistor R65 for applications where noise is important such as low-noise amplifiers.

In an ideal differential circuit, the sum of the currents through the two transistors is constant. This is the current that flows through the current-sensing resistor R45 of FIG. 4. Although the sum of the currents is constant, the current flowing through the input transistors B41 and B42 is not necessarily constant. For example, suppose that the sum of the currents through transistors B41 and B42 is IO. When the voltage is raised on the base of transistor B41 relative to the voltage on the base of transistor B42, a higher percentage of the current will flow through transistor B41 than through transistor B42. Information is carried by the difference of the currents. This is where the term differential amplifier comes from.

The single-ended amplifiers of FIG. 5 is not a differential amplifier. For this amplifier, the current flowing through the current-sensing resistor R55 will vary directly with the input signal. Capacitor C52 shunts most of the high-frequency current away from the current-sensing resistor to ground, ideally leaving only the DC current flowing through resistor R55. In reality, there will be some high-frequency current flowing through resistor R55, but, if it is high enough in frequency, the feedback loop will not respond fast enough to compensate for the AC variations. The result is that the feedback loop effectively responds only to the average current flowing through resistor R55 and sets the average bias current to some desired level based on the reference voltage. If the frequency is high enough, it should be possible to operate the amplifier without capacitor C52, since the feedback loop cannot respond that quickly anyway and will only be able to control the average current in the amplifier, as desired.

In reality, the differential circuit of FIG. 4 also responds to just the average level. In an ideal circuit, the sum of the currents in the input transistors will always be equal to this average level. In reality, there will be some high-frequency variation and this is why the filter exists in the feedback loop of FIG. 4.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An integrated circuit having a transconductance amplifier adapted to convert a first input voltage into an output current, the transconductance amplifier comprising:
    (a) a first transistor configured to provide both DC bias and AC gain for the transconductance amplifier, wherein the output current corresponds to the current from the collector of the first transistor; and
    (b) a bias circuit, configured to bias the first transistor, wherein the bias circuit comprises:
        (1) a first DC-blocking capacitor connected between the first input voltage and a control terminal of the first transistor;
        (2) an operational amplifier having first and second inputs and an output, wherein the first input is configured to receive a reference voltage;
        (3) a first impedance connected between the output of the operational amplifier and the control terminal of the first transistor; and
        (4) a current-detecting resistor configured to generate a sensed voltage corresponding to the current at the emitter of the first transistor, wherein a feedback voltage corresponding to the sensed voltage is applied in a feedback loop to the second input of the operational amplifier to drive the voltage at the control terminal of the first transistor towards equalizing the feedback voltage and the reference voltage to establish an operating condition for the transconductance amplifier.

2. The invention of claim 1, wherein the reference voltage is generated by a current source configured to drive a reference current into a reference resistor.

3. The invention of claim 2, wherein the value of the reference resistor is M times larger than the value of the current-sensing resistor and the output current is approximately M times larger than the reference current.

4. The invention of claim 1, wherein the transconductance amplifier is a single-ended amplifier.

5. The invention of claim 1, wherein: the transconductance amplifier is a differential amplifier adapted to convert a differential input voltage comprising the first input voltage and a second input voltage into the output current, the transconductance amplifier further comprising a second transistor and the output current being the difference of currents through the first and second transistors; and
    the bias circuit further comprises:
        (5) a second DC-blocking capacitor connected between the second input voltage and a control terminal of the second transistor; and
        (6) a second impedance connected between the output of the operational amplifier and the control terminal of the second transistor, wherein the operational amplifier drives the voltages at the control terminals of the first and second transistors towards equalizing the feedback voltage and the reference voltage to establish the operating condition for the transconductance amplifier.

6. The invention of claim 1, wherein the bias circuit further comprises a resonant circuit is in series with the current-detecting resistor.

7. The invention of claim 6, wherein the resonant circuit comprises an inductor in parallel with a capacitor.

8. The invention of claim 6, wherein the resonant circuit comprises an inductor that is self-resonant at a desired operating frequency.

9. The invention of claim 1, wherein the first impedance is resistor.

10. The invention of claim 1, wherein the first transistor is a bipolar device.

11. The invention of claim 1, wherein the bias circuit further comprises a degeneration device in series with the emitter of the first transistor.

12. The invention of claim 11, wherein the degeneration device is an inductor.

13. The invention of claim 1, wherein the transconductance amplifier is adapted to be connected to an inductor external to the integrated circuit functioning as a degeneration device.

14. The invention of claim 1, wherein the bias circuit further comprises a filter in the feedback loop configured to filter the sensed voltage and generate the feedback voltage.

15. The invention of claim 1, wherein: the reference voltage is generated by a current source configured to drive a reference current into a reference resistor;
    the first impedance is a resistor;
    the transconductance amplifier is a differential amplifier adapted to convert a differential input voltage comprising the first input voltage and a second input voltage into the output current, the transconductance amplifier further comprising a second transistor and the output current being the difference of currents through the first and second transistors;

the bias circuit further comprises:

(5) a second DC-blocking capacitor connected between the second input voltage and a control terminal of the second transistor;

(6) a second resistor connected between the output of the operational amplifier and the control terminal of the second transistor, wherein the operational amplifier drives the voltages at the control terminals of the first and second transistors towards equalizing the feedback voltage and the reference voltage to establish the operating condition for the transconductance amplifier;

(7) a resonant circuit between the first and second transistors and ground;

(8) a degeneration inductor configured between each of the first and second transistors and ground; and (9) a filter in the feedback loop configured to filter the sensed voltage and generate the feedback voltage.

16. The invention of claim 15, wherein the first and second transistors are bipolar devices.

17. An integrated circuit having a transconductance amplifier adapted to convert a first input voltage into an output current, the transconductance amplifier comprising:

(a) a first transistor configured to provide both DC bias and AC gain for the transconductance amplifier; and (b) a bias circuit, configured to bias the first transistor, wherein the bias circuit comprises:

(1) a first DC-blocking capacitor connected between the first input voltage and a control terminal of the first transistor;

(2) an operational amplifier having first and second inputs and an output, wherein the first input is configured to receive a reference voltage;

(3) a first impedance connected between the output of the operational amplifier and the control terminal of the first transistor; and (4) a current-detecting resistor configured to generate a sensed voltage corresponding to the output current, wherein:

a feedback voltage corresponding to the sensed voltage is applied in a feedback loop to the second input of the operational amplifier to drive the voltage at the control terminal of the first transistor towards equalizing the feedback voltage and the reference voltage to establish an operating condition for the transconductance amplifier;

the reference voltage is generated by a current source configured to drive a reference current into a reference resistor; and the value of the reference resistor is M times larger than the value of the current-sensing resistor and the output current is approximately M times larger than the reference current.

18. An integrated circuit having a differential transconductance amplifier adapted to convert a differential input voltage comprising a first input voltage and a second input voltage into an output current, the transconductance amplifier comprising:

(a) first and second transistors configured to provide both DC bias and AC gain for the transconductance amplifier, the output current being the difference of currents through the first and second transistors; and (b) a bias circuit, configured to bias the first and second transistors, wherein the bias circuit comprises:

(1) a first DC-blocking capacitor connected between the first input voltage and a control terminal of the first transistor;

(2) a second DC-blocking capacitor connected between the second input voltage and a control terminal of the second transistor;

(3) an operational amplifier having first and second inputs and an output, wherein the first input is configured to receive a reference voltage;

(4) a first impedance connected between the output of the operational amplifier and the control terminal of the first transistor;

(5) a second impedance connected between the output of the operational amplifier and the control terminal of the second transistor; and (6) a current-detecting resistor configured to generate a sensed voltage corresponding to the output current, wherein a feedback voltage corresponding to the sensed voltage is applied in a feedback loop to the second input of the operational amplifier to drive the voltages at the control terminals of the first and second transistors towards equalizing the feedback voltage and the reference voltage to establish an operating condition for the transconductance amplifier.

19. The invention of claim 18, wherein the reference voltage is generated by a current source configured to drive a reference current into a reference resistor.

20. The invention of claim 19, wherein the value of the reference resistor is M times larger than the value of the current-sensing resistor and the output current is approximately M times larger than the reference current.

21. The invention of claim 18, wherein the bias circuit further comprises a resonant circuit is in series with the current-detecting resistor.

22. The invention of claim 21, wherein the resonant circuit comprises an inductor in parallel with a capacitor.

23. The invention of claim 21, wherein the resonant circuit comprises an inductor that is self-resonant at a desired operating frequency.

24. The invention of claim 18, wherein the bias circuit further comprises a degeneration device in series with the emitters of the first and second transistors.

25. The invention of claim 24, wherein the degeneration device is an inductor.

26. The invention of claim 18, wherein the transconductance amplifier is adapted to be connected to an inductor external to the integrated circuit functioning as a degeneration device.

27. The invention of claim 18, wherein the bias circuit further comprises a filter in the feedback loop configured to filter the sensed voltage and generate the feedback voltage.

28. An integrated circuit having a transconductance amplifier adapted to convert a first input voltage into an output current, the transconductance amplifier comprising:

(a) a first transistor configured to provide both DC bias and AC gain for the transconductance amplifier; and (b) a bias circuit, configured to bias the first transistor, wherein the bias circuit comprises:

(1) a first DC-blocking capacitor connected between the first input voltage and a control terminal of the first transistor;

(2) an operational amplifier having first and second inputs and an output, wherein the first input is configured to receive a reference voltage;

(3) a first impedance connected between the output of the operational amplifier and the control terminal of the first transistor; and (4) a current-detecting resistor configured to generate a sensed voltage corresponding to the output current, wherein:

a feedback voltage corresponding to the sensed voltage is applied in a feedback loop to the second input of the operational amplifier to drive the voltage at the control terminal of the first transistor towards equalizing the feedback voltage and the reference voltage to establish an operating condition for the transconductance amplifier; and the bias circuit further comprises a resonant circuit is in series with the current-detecting resistor.

29. The invention of claim 28, wherein the resonant circuit comprises an inductor in parallel with a capacitor.

30. The invention of claim 28, wherein the resonant circuit comprises an inductor that is self-resonant at a desired operating frequency.

31. An integrated circuit having a transconductance amplifier adapted to convert a first input voltage into an output current, the transconductance amplifier comprising:

(a) a first transistor configured to provide both DC bias and AC gain for the transconductance amplifier; and (b) a bias circuit, configured to bias the first transistor, wherein the bias circuit comprises:

(1) a first DC-blocking capacitor connected between the first input voltage and a control terminal of the first transistor;

(2) an operational amplifier having first and second inputs and an output, wherein the first input is configured to receive a reference voltage;

(3) a first impedance connected between the output of the operational amplifier and the control terminal of the first transistor; and (4) a current-detecting resistor configured to generate a sensed voltage corresponding to the output current, wherein:

a feedback voltage corresponding to the sensed voltage is applied in a feedback loop to the second input of the operational amplifier to drive the voltage at the control terminal of the first transistor towards equalizing the feedback voltage and the reference voltage to establish an operating condition for the transconductance amplifier;

the bias circuit further comprises a degeneration device in series with the emitter of the first transistor; and the degeneration device is an inductor.

32. An integrated circuit having a transconductance amplifier adapted to convert a first input voltage into an output current, the transconductance amplifier comprising:

(a) a first transistor configured to provide both DC bias and AC gain for the transconductance amplifier; and (b) a bias circuit, configured to bias the first transistor, wherein the bias circuit comprises:

(1) a first DC-blocking capacitor connected between the first input voltage and a control terminal of the first transistor;

(2) an operational amplifier having first and second inputs and an output, wherein the first input is configured to receive a reference voltage;

(3) a first impedance connected between the output of the operational amplifier and the control terminal of the first transistor; and (4) a current-detecting resistor configured to generate a sensed voltage corresponding to the output current, wherein:

a feedback voltage corresponding to the sensed voltage is applied in a feedback loop to the second input of the operational amplifier to drive the voltage at the control terminal of the first transistor towards equalizing the feedback voltage and the reference voltage to establish an operating condition for the transconductance amplifier; and the transconductance amplifier is adapted to be connected to an inductor external to the integrated circuit functioning as a degeneration device.

* * * * *